United States Patent [19]
Arnowitz et al.

[11] Patent Number: 5,961,934
[45] Date of Patent: Oct. 5, 1999

[54] DYNAMICALLY CONTROLLED CRYSTALLIZATION METHOD AND APPARATUS AND CRYSTALS OBTAINED THEREBY

[75] Inventors: Leonard Arnowitz, Chevy Chase, Md.; Emanuel Steinberg, Tel Aviv, Israel

[73] Assignee: Biospace International Inc., College Park, Md.

[21] Appl. No.: 09/025,475

[22] Filed: Feb. 18, 1998

[51] Int. Cl.⁶ .............................. B01D 9/00; C30B 23/00
[52] U.S. Cl. ...................... 422/245.1; 422/253; 422/236; 422/62; 117/68; 117/201; 117/202; 23/295
[58] Field of Search ................................ 422/245.1, 236, 422/253; 23/295; 117/68, 201, 202

[56] References Cited

U.S. PATENT DOCUMENTS

| | | |
|---|---|---|
| 4,263,010 | 4/1981 | Randolph . |
| 4,755,363 | 7/1988 | Fujita et al. . |
| 4,776,944 | 10/1988 | Janata et al. . |
| 4,909,933 | 3/1990 | Carter et al. . |
| 4,917,707 | 4/1990 | Claramonte et al. . |
| 4,919,900 | 4/1990 | Martin et al. . |
| 5,013,531 | 5/1991 | Snyder et al. . |
| 5,087,338 | 2/1992 | Perry et al. . |
| 5,106,592 | 4/1992 | Stapelmann et al. . |
| 5,110,406 | 5/1992 | Sill et al. . |
| 5,131,994 | 7/1992 | Shmidt et al. . |
| 5,143,588 | 9/1992 | Liboff et al. . |
| 5,234,566 | 8/1993 | Osman et al. . |
| 5,248,426 | 9/1993 | Stillian et al. . |
| 5,362,325 | 11/1994 | Shiraishi et al. . |
| 5,597,457 | 1/1997 | Craig et al. . |
| 5,641,681 | 6/1997 | Carter . |
| 5,643,540 | 7/1997 | Carter et al. . |

OTHER PUBLICATIONS

Bosch, R., et al., "Experiment Equipment for Protein Crystallization in μg facilities," *Journal of Crystal Growth*, vol. 122, pp. 310–316 (1992).

DeLucas, L.J., et al., "Preliminary Investigations of Protein Crystal Growth Using The Space Shuttle," *Journal of Crystal Growth*, vol. 76, pp. 681–693 (1986).

DeLucas, L.J., et al., "Protein Crystal Growth in Microgravity," vol. 246, *Science*, pp. 651–654, (1989).

DeLucas, L.J., et al., "Protein Crystal Growth in Space," *Advances in Space Biology and Medicine*, vol. 1, pp. 249–278 (1991).

DeLucas, L.J., et al., "Protein crystal growth results for shuttle flights STS–26 and STS–29," *Journal of Crystal Growth*, vol. 110, pp. 302–311 (1991).

DeLucas, L.J., et al., "Recent results and new hardware developments for protein crystal growth in microgravity," *Journal of Crystal Growth*, vol. 135, pp. 183–195 (1994).

Durbin, S.D., et al., "Protein Crystallization," *Annual Review of Physics and Chemistry*, vol. 47, pp. 171–204 (1996).

Gannon, R. "The Unbearable Lightness of Space Travel," *Popular Science*, pp. 74–79 (Mar. 1993).

Hale, B. "Life Sciences in Orbit," *The Penn Stater*, pp. 54–56 (Jan./Feb. 1991).

(List continued on next page.)

*Primary Examiner*—Robert J. Warden, Sr.
*Assistant Examiner*—James Kennedy
*Attorney, Agent, or Firm*—Venable; John W. Schneller

[57] ABSTRACT

A method and apparatus for dynamically controlling the crystallization of proteins including a crystallization chamber or chambers for holding a protein in a salt solution, one or more salt solution chambers, two communication passages respectively coupling the crystallization chamber with each of the salt solution chambers, and transfer mechanisms configured to respectively transfer salt solution between each of the salt solution chambers and the crystallization chamber. The transfer mechanisms are interlocked to maintain the volume of salt solution in the crystallization chamber substantially constant. Salt solution of different concentrations is transferred into and out of the crystallization chamber to adjust the salt concentration in the crystallization chamber to achieve precise control of the crystallization process.

14 Claims, 2 Drawing Sheets

OTHER PUBLICATIONS

Hale, B. "Out of This World."
Information Packet from the Center for Macromolecular Crystallography, University of Alabama, Birmingham.
Hennig et al. *J. Cryst. Growth*, vol. 135, pp. 513–522 (1994).
Littke, W., et al., "Protein Single Crystal Growth Under Microgravity," *Journal of Crystal Growth*, vol. 76, pp. 663–672 (1986).
Mann, P., ed., "Washington Outlook," *Aviation Week & Space Technology*, p. 23 (Aug. 1994).
"MI–405 Operating Instructions" by Microelectrodes, Inc.
"MI–900 Series Operating Instructions for All Conductivity Electrodes" by Microelectrodes, Inc.
Mulley, F.T., "Let There Be Light," *The Penn Stater*, pp. 34–39 (Mar./Apr. 1994).
Penn State, "An Overview—Center for Cell Research," *A Center for the Commercial Development of Space; National Aeronautics and Space Administration*.
Penn State, "The Center for Cell Research," *A Center for the Commercial Development of Space; National Aeronautics and Space Administration*, vol. 1, No. 1 (Sep. 1990).
Penn State, "The Center for Cell Research," *A Center for the Commercial Development of Space; National Aeronautics and Space Administration*, vol. 1, No. 2 (Dec. 1990).
Penn State, "The Center for Cell Research," *A Center for the Commercial Development of Space; National Aeronautics and Space Administration*, vol. 1, No. 3 (Mar. 1991).
Penn State, "The Center for Cell Research," *A Center for the Commercial Development of Space; National Aeronautics and Space Administration*, vol. 1, No. 4 (Jun. 1991).
Penn State, "The Center for Cell Research," *A Center for the Commercial Development of Space; National Aeronautics and Space Administration*, vol. 2, No. 1 (Jan. 1992).
Penn State, "The Center for Cell Research," *A Center for the Commercial Development of Space; National Aeronautics and Space Administration*, vol. 2, No. 2 (Apr. 1992).
Penn State, "The Center for Cell Research," *A Center for the Commercial Development of Space; National Aeronautics and Space Administration*, vol. 2, No. 3 (Aug. 1992).
Penn State, "The Center for Cell Research," *A Center for the Commercial Development of Space; National Aeronautics and Space Administration*, vol. 2, No. 4 (Dec. 1992).
Penn State, "The Center for Cell Research," *A Center for the Commercial Development of Space; National Aeronautics and Space Administration*, vol. 3, No. 1 (Mar./Apr. 1993).
Second International Microgravity Laboratory, IM L–2, NASDA.
Sibille, L., et al., "Analysis of solvent evaporation rates in the vapor diffusion protein crystal growth experiments from the STS–61C Space Shuttle Mission," *Journal of Crystal Growth*, vol. 110, pp. 72–79 (1991).
Sieker, L.C. "Microdialysis Crystallization Chamber," *Journal of Crystal Growth*, vol. 90, pp. 349–357 (1988).
Sjölin, L., et al., "Protein crystal growth of Ribonuclease A and Pancreatic Trypsin Inhibitor aboard the MASER 3 rocket," *Journal of Crystal Growth*, vol. 110, pp. 322–332 (1991).
Snyder, R.S., et al., "Protein crystallization facilities for microgravity experiments," *Journal of Crystal Growth*, vol. 110, pp. 333–338 (1991).
Stoddard, B.L., et al., "Design of apparatus and experiments to determine the effect of microgravity on the crystallization of biological macromolecules using the MIR spacestation," *Journal of Crystal Growth*, vol. 110, pp. 312–316 (1991).
"STS–65/IML–2," *Microgravity Sciences and Application Division*.
Sygusch, J., et al., "Protein crystallization in low gravity by step gradient different method," *Journal of Crystal Growth*, vol. 162, pp. 167–172 (1996).
"The Effects of Microgravity," *Chemistry in Britain*, pp. 626–630 (Jul. 1992).
Trakhanov, S.D., et al., "Crystallization of protein and ribosomal particles in microgravity," *Journal of Crystal Growth*, vol. 110, pp. 317–321 (1991).
Wood–Kaczmar, B. "Making the most of weightlessness," *New Scientist*, pp. 38–41 (Jul. 11, 1992).
Zeelen et al. *J. Cryst. Growth*, vol. 122, pp. 194–198 (1992).

DYNAMICALLY CONTROLLED CRYSTALLIZATION METHOD AND APPARATUS AND CRYSTALS OBTAINED THEREBY

GOVERNMENT LICENSE RIGHTS

The U.S. Government has a paid-up license in this invention and the right in limited circumstances to require the patent owner to license others on reasonable terms as provided for by the terms of Contract No. NAS8-97010 awarded by NASA, George C. Marshall Space Flight Center, and Grant No. 2R44GM53300-02 awarded by NIH and the National Institute of General Medical Sciences.

BACKGROUND OF THE INVENTION

1. Field of the Invention

This invention relates to the formation of protein crystals and more particularly to a method and apparatus for dynamically controlling the process of forming protein crystals as well as to the crystals formed by the method and apparatus.

2. Description of the Related Art

The concept of rational drug design involves obtaining the precise three dimensional molecular structure of a specific protein to permit design of drugs that selectively interact with and adjust the function of that protein. Theoretically, if the structure of a protein having a specified function is known, the function of the protein can be adjusted as desired. This permits a number of diseases and symptoms to be controlled. For example, CAPTOPRIL is a well known drug for controlling hypertension that was developed through rational drug design techniques, CAPTOPRIL inhibits generation of the angiotension-converting enzyme thereby preventing the constriction of blood vessels. The potential for controlling disease through drugs developed by rational drug design is tremendous.

X-ray crystallography techniques are utilized to obtain a "fingerprint", i.e. the precise three-dimensional shape, of a protein crystal. However, a critical step to rational drug design is the ability to reliably crystallize a wide variety of proteins. Therefore, a great deal of time and money have been spent crystallizing proteins for analysis. Recent biotechnological developments in protein cloning, over expression, and affinity purification of proteins will likely increase the need for a reliable way in which to grow various protein crystals. Unfortunately protein crystallization is quite difficult.

Protein crystallization involves the creation of a supersaturated protein solution under conditions that promote minimum protein solubility and the orderly transition of macromolecules from the solution into a crystal lattice. The variables that must be controlled precisely to promote crystal growth include temperature, protein solution concentration, salt solution concentration and pH, for example. These variables are carefully controlled and optimum combinations thereof are determined through experimentation to yield superior crystals.

The crystallization process generally involves three distinct phases; nucleation, sustained crystal growth, and termination of crystal growth. Nucleation is the initial formation of an ordered grouping of a few protein molecules and requires a protein in a salt solution at a particular concentration. On the other hand, the continued growth phase consists of the addition of protein molecules to the growing faces of the crystal lattice and requires lower concentrations of salt solution than the nucleation phase. The termination phase can be initiated by poisoning the growing lattice with denatured protein or a different protein, by depletion of the protein solution or by changing the salt concentration to a specified level. The protein is often referred to as a "reactant" and the salt solution is often referred to as a "reagent" in crystallization processes.

It is considered desirable to obtain a small number of crystallization nuclei quickly that will grow slowly into full size crystals. Theoretically, this allows for a relatively large size of the resulting crystals, homogenous crystal order and morphology and balanced crystal dimensions. Therefore, it is desirable to begin crystallization with a particular salt concentration until nucleation is detected, at which point it is desirable to adjust the concentration of salt. Thus, one of the critical requirements of any protein crystallization process is the fine and dynamic control of the various parameters that determine the concentration of the salt solution in which the target protein is suspended. This control requires the ability to attain nucleation conditions and the ability to modify the concentration of the salt solution without disturbing the crystallization process.

There are several conventional techniques for forming protein crystals; for example, liquid diffusion, vapor diffusion and dialysis techniques. These processes are relatively slow and cannot readily be controlled dynamically. Therefore, these processes require complex and largo apparatus in order to control crystallization if crystallization can be controlled at all, Accordingly, it is desirable to overcome these limitations.

Most conventional crystallization methods mix a protein solution with a crystallizing (or precipitant) solution to accomplish crystallization. In terms of mechanics, use is commonly made of syringes, stepping motors, valves of various types, membranes to separate solutions, and in one case, a gel to replace the membrane and act as a delaying filter device between solutions. U.S. Pat. Nos. 4,917,707, 5,106,592, 5,641,681 and Microdialysis Crystallization Chamber, L. C. Sieker, J. Crystal Growth 90 (1988) 349–357, the entire contents of which are incorporated herein by reference, disclose these concepts.

It is known to "control" the crystallization process. However, only the movement of liquids via pumps, valves and syringes is controlled in conventional crystallization processes. This control creates a static condition (bath concentration) which is predefined for the protein in question. For example, U.S. Pat. No. 4,755,363, the entire contents of which are incorporated herein by reference, discloses delivering liquids at desired flow rates and concentrations, However, U.S. Pat. No. 4,755,363 fails to disclose changing conditions within the crystallization chamber (with the exception of temperature) once those conditions have been set and crystallization has begun.

Temperature is an important parameter that can be controlled to optimize conditions separately for nucleation or growth. U.S. Pat. Nos. 4,755,363 and 5,362,325, the entire contents of which are incorporated herein by reference, are exemplary of patents disclosing temperature control in crystallization processes. U.S. Pat. No. 5,362,325 discloses varying the concentration of a crystallizing agent, over time, to produce a predetermined gradient in the concentration of the crystallizing agent. However, this reference fails to disclose dynamic control.

Automation is a recent trend in crystallography. Robotics enables systematic pipetting of solutions and protein into crystal growth chambers on plates, so that a multiplicity of conditions can be examined more quickly and consistently.

The use of robotics frees valuable time for researchers. Another trend is the us- of semi-automated techniques to record results.

Also, an inherent limitation in any crystallization process is the effects of molecular convection, thermal effects and buoyancy, all due to the earth's gravitational field. Therefore, crystallization experiments have been proposed and conducted in microgravity ($1/1000$ g to $1/10,000$ g) on board the Space Shuttle, International Space Station, and other vehicles. Several patents disclose crystallization in microgravity to improve the size, morphology and diffraction quality of crystals. U.S. Pat. Nos. 5,362,325 and 4,755,363, which are incorporated herein by reference, are exemplary of patents disclosing microgravity crystallization. In fact, a low gravity environment is "crucial" (emphasis added) to the success of one apparatus (Sygusch, et al. J. Crystal Growth 162 (1996) 167–172). Early experiments indicate that larger and more homogenous crystals can be grown in microgravity environments by eliminating the effects of the earth's gravitational field. However, the practical limitations of using current space vehicles, such as the Space Shuttle, render it difficult to use conventional apparatus/methods for crystallization in microgravity environments. Particularly, conventional apparatus are too large, are difficult to control remotely and automatically, have many moving parts that can fail, do not permit accurate change of solution concentration during the process and are not entirely reusable. Also, known processes require too much time to produce fully grown crystals. Therefore, it is desirable to overcome these deficiencies to permit crystal growth experiments in space under microgravity conditions. Also, conventional apparatus and methods do not facilitate experimentation in which the only variable is the presence or absence of the earth's gravitational field because conventional crystallization apparatus must be modified significantly for use in space. Moreover, the foregoing methods and apparatus do not provide a dynamic control capability in either the earth's gravitational field or in microgravity.

SUMMARY OF THE INVENTION

It is an object of the invention to control a protein crystallization process precisely and dynamically.

It is another object to the invention to control a protein crystallization process remotely in real time.

It is another object to the invention to control a protein crystallization process in a predetermined manner.

It is another object of the invention to permit termination or reversal of a crystallization process.

It is another object of the invention to reduce the size and number of moving parts in a crystallization method and apparatus.

It is another object of the invention to produce protein crystals in a sealed system.

It is another object of the invention to conduct protein crystallization experiments in space and on earth with identical apparatus.

It is another object of the invention to control crystallization parameters in a sealed system without changing the pressure in the crystallization chamber.

It is still further an object of the invention to produce large protein crystals in a very short period of time.

The present invention is an apparatus and method for dynamically monitoring and controlling protein crystal growth. The present invention also identifies optimum crystallization conditions while using less experiments and substantially less protein.

The present invention creates a dynamic condition or control. "Dynamic Control" as used herein means that: (1) the crystallization process can be started at will, (2) several conditions (see, for example Durbin, S. & Feher, G. AnM Rev Phys Chem 47 (1996) 171–204, the entire contents of which are incorporated herein by reference) that are important for protein crystal growth (pH, temperature, conductivity, etc.) can be monitored, and implicit in this is the ability to determine molarity or salt concentration in the crystallization chamber by measurement of the latter parameter, (3) decisions can be made based upon these parameters, (4) these conditions can be very precisely controlled at any time during the crystallization process, (5) the crystallization process can be stopped when desired and (6) the process can be reversed if so desired.

The operation of the present invention is compatible with the microgravity environment. A complex set of variables in the process of crystal growth are rigorously examined, manipulated and controlled so that microgravity is the only variable. The present invention has real time remote-controlled operative capabilities. The present invention is conservative in terms of cost containment for flights aboard the Space Shuttle and the International Space Station. Use of this invention conserves both money and valuable astronaut time. The present invention can remain on a space platform for many sets of experiments, while the protein crystallization chamber can return to earth with the proteins that are crystallized in space. New chambers, tubing and syringes can be delivered on the next flight pre-loaded. The invention can be readily miniaturized and thus the entire unit is less expensive to transport to and from space.

In order to achieve these objects, a first aspect of the invention includes at least one crystallization chamber for holding a protein in a salt solution, one or more salt solution chambers, two communication passages respectively coupling the crystallization chamber with each of the salt solution chambers and transfer mechanisms configured to respectively transfer salt solution between each of the salt solution chambers and the crystallization chamber. The transfer mechanisms can work in cooperation to transfer equal amounts of salt solution into and out of the crystallization chamber.

A second aspect of the invention is a method of controlling a protein crystallization process including placing a protein in a salt solution having a first concentration (or molarity) in a crystallization chamber, placing a salt solution of a second concentration (or molarity) in a first salt solution chamber, transferring salt solution between the salt solution chamber and the crystallization chamber to thereby adjust the concentration of protein solution in the crystallization chamber with respect to time. The initial concentration of the salt solution in the salt solution chamber is different than the initial concentration of the salt solution in the crystallization chamber. Therefore, when salt solution is transferred, the concentration of the salt solution in the crystallization chamber changes. In this manner, the concentration of the salt solution in the crystallization chamber can be adjusted dynamically to provide optimum crystallization conditions with respect to time.

The invention thus permits the crystallization process to be controlled easily, merely by operating the transfer mechanisms. This permits the method/apparatus of the invention to be easily applied on earth or in micro gravity environments. A sealed system can be used without pressure change in the crystallization chamber. Also, the invention permits termination or reversal of the crystallization process, variable salt concentration during the process, and conservation of the protein crystal sample for further experimentation. Further, the invention produces crystals in a reduced time with few moving parts and low power requirements.

BRIEF DESCRIPTION OF THE DRAWINGS

The invention will be described through a preferred embodiment and the attached drawing in which.

DETAILED DESCRIPTION OF THE PREFERRED EMBODIMENT OF THE INVENTION

Figure 1:
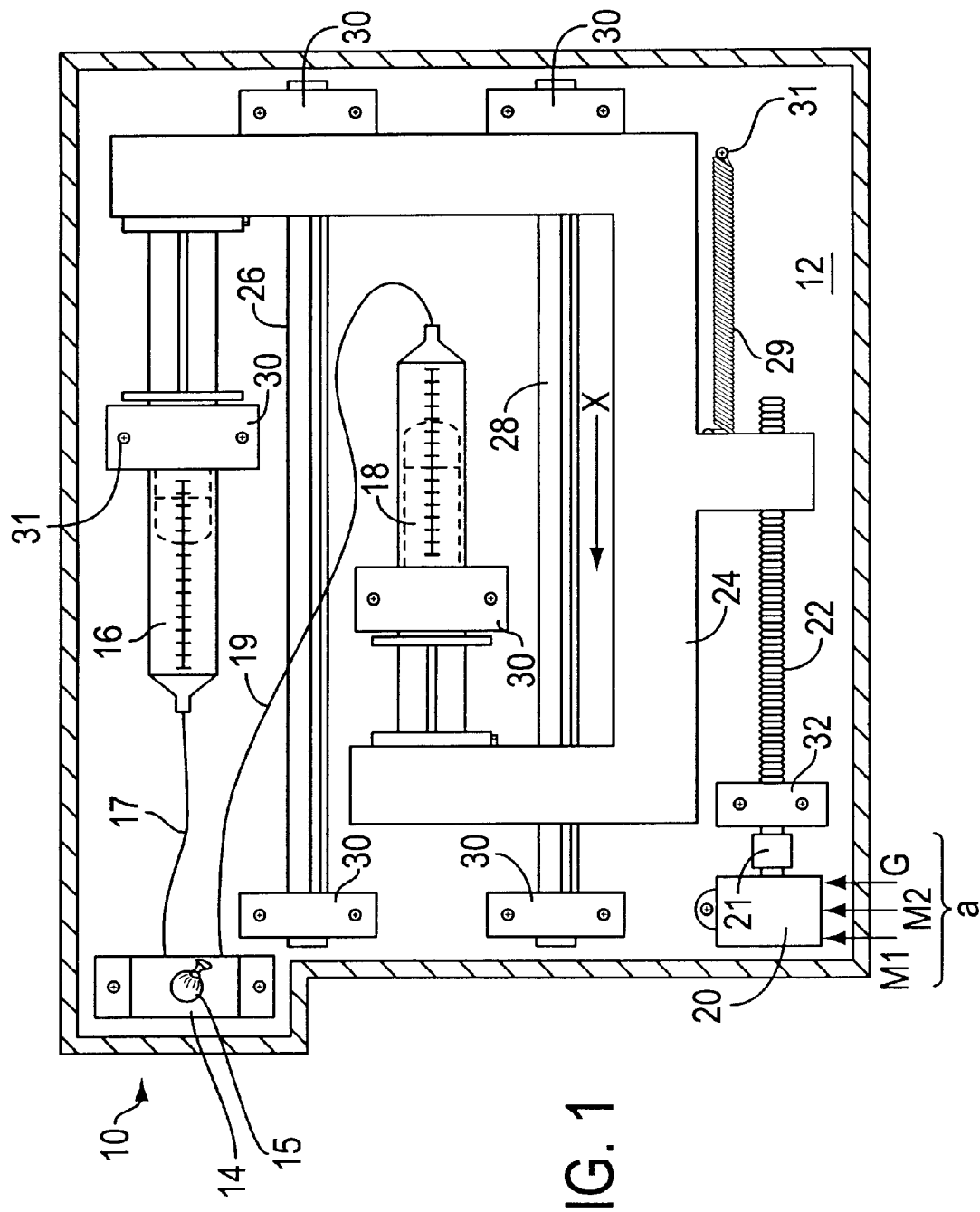
FIG. 1 is a plan view of a crystallization apparatus of the invention.

FIG. 1 illustrates protein crystallization apparatus 10 in accordance with the invention. Apparatus 10 includes rigid base plate 12, crystallization chamber 14 in which crystallization is to occur, syringe 16, syringe 18, lead screw 22, yoke 24, and guide rods 26 and 28. Dialysis sack 15 is removably disposed inside crystallization chamber 14. Syringe 16 is coupled to crystallization chamber 14 by tube 17 serving as a conduit. Syringe 18 is coupled to crystallization chamber 14 by tube 19 serving as a conduit. Syringes 16 and 18 serve as salt solution chambers as described in detail below. Plungers of syringe 16 and syringe 18 face in opposing directions and are coupled to yoke 24 which serves as an interlock as described below. Further, yoke 24 is slidably disposed on guide rods 26 and 28. Lead screw 22 is coupled to a shaft of motor 20 via vibration absorbing coupling 21 and is threadably engaged with yoke 24. Syringe 16, syringe 18, guide rod 26 and guide rod 28 are fixedly coupled to base plate 12 by mounting blocks 30 and screws 31 as shown. Mounting block 32 is fixed to base plate 12 by screws 31 and has a bearing for permitting rotation of lead screw 22 while axially fixing lead screw 22 to base plate 12. Further, crystallization chamber 14 and stepper motor 20 are also fixed to base plate 12 by screws 31. Spring 29 is coupled to base plate 12 by screw 31 at one end and to yoke 24 at another end to bias yoke 24 in one direction against threads of lead screw 22 to thereby minimize backlash when yoke 24 is moved linearly as described below.

Activation of motor 20 will cause lead screw 22 to rotate and thereby will cause yoke 24 to slide linearly along guide rods 26 and 28. Of course, linear motion of yoke 24 will cause the plunger of syringe 16 to move in one direction and will cause the plunger of syringe 18 to move in the opposite direction through the same distance. Prior to a crystallization process, the target protein in a salt solution is loaded into crystallization chamber 14.

Crystallization chamber 14 comprises a system for retaining macromolecules, such as proteins and DNA, but allowing for the passage of smaller molecules. A membrane or permanent sieve having a molecular weight cut-off of a predetermined value may be used in this regard. The membrane may be a part of a dialysis sack, or may be a sheet of dialysis membrane. In any case, the molecular weight cut-off should be lower than the molecular weight of the macromolecule in the crystallization chamber, and should significantly reduce movement of the macromolecule out of the crystallization chamber. However, the membrane or sieve should not significantly hinder the movement of smaller molecules which might include ions and non-ionic solutes. In preferred embodiments of the present invention, the crystallization chamber comprises a cover which includes a recessed portion. The cover itself may be recessed for this purpose, or the cover may comprise a button-shaped protrusion which is recessed for this purpose. Preferably, the cover comprises a button-shaped protrusion which is recessed. The recess serves as a compartment into which may be placed a solution containing a macromolecule for crystallization. The recess would then be covered by a membrane as described above. An elastic O-ring, gasket, or other retainer may be used to hold the membrane in place. Alternatively, dialysis sack 15 is placed directly into the crystallization chamber for retention of the macromolecule. Dialysis sack 15 is illustrated schematically in FIG. 1. Additional salt solution is preferably disposed around dialysis sack 15. Other manners of retaining the macromolecule in the crystallization chamber will be readily apparent to one of ordinary skill in the art.

A salt solution is loaded into syringe 16 (and optionally syringe 18 also). Accordingly, activation of motor 20 in a direction, causing yoke 24 to move in the direction of arrow X will cause salt solution stored in syringe 16 to be transferred into crystallization chamber 14 while simultaneously causing salt solution to be transferred out of crystallization chamber 14 and into syringe 18. If the respective concentrations of the salt solution in crystallization chamber 14, syringe 16, and syringe 18, are set to be of different predetermined values prior to crystallization, the concentration of salt solution in crystallization chamber 14 can be controlled dynamically, i.e. with respect to time merely by operating motor 20 in a desired manner with respect to time.

For example, for certain proteins, it has been found that a salt concentration of about 0.15M (moles) facilitates crystallization in the salt solution. Also, it has been found that it is desirable to approach this concentration very slowly and that the rate of approach can be critical in yielding desired results. Therefore, in the preferred embodiment, crystallization chamber 14 can initially contain protein in a salt solution at a concentration of 1M (a concentration which does not permit crystallization.) Syringe 16 can initially contain a salt solution at a concentration of 0.1 mole, for example. Further, syringe 18 can initially contain protein solution at a concentration of 1 mole. With this arrangement to initiate a crystallization process, motor 20 can be activated to move yoke 24 in the direction of arrow X in FIG. 1 to thereby transfer a small amount of low concentration salt solution from syringe 16 into crystallization chamber 14 and simultaneously transfer high concentration salt solution from crystallization chamber 14 into syringe 18. It can be seen that this procedure lowers the concentration of the salt solution in crystallization chamber 14. Of course, motor 20 can be activated in desired increments to cause the rate of change of concentration of the solution in crystallization chamber 14 to be a desired value with respect to time. Further, motor 20 will be stopped when the concentration of the salt solution in crystallization chamber 14 has reached an optimum level for initiating crystallization, e.g. 0.15M. A sensor can be placed in the crystallization chamber to provide feedback to permit closed loop control. For example, a sensor which measures the electrical resistance or other electrical properties of the salt solution in crystallization chamber 14 can be used to indicate the concentration of the solution in crystallization chamber 14 because electrical properties of the salt solution changes as the concentration changes. Of course, motor 20 can be operated, in response to the detected concentration in a preprogrammed manner. The amount of salt solution that must be transferred to facilitate crystallization can be determined experimentally or empirically.

Further, motor 20 can be operated to move yoke 22 in a reverse direction, i.e. a direction opposite arrow X, to cause salt solution to flow from syringe 18 into crystallization chamber 14 and from crystallization chamber 14 into syringe 16, to thereby raise the concentration of salt solution in crystallization chamber 14. In this manner, the concentration of salt solution in crystallization chamber 14 can be finely adjusted and raised or lowered to a value which will stop, or even reverse, the crystallization process. Therefore, precise dynamic control of the crystallization process can be achieved.

Motor 20 can be a stepper motor such as Model No. STP42 ND 4BLVE-100 manufactured by EPSON AMERICAN. Also, the MfTSD-V1 motor driver, manufactured by MODERN TECHNOLOGY, INC., can be used to control motor 20. A controller that facilitates predetermined programmable control of the crystallization process is described in detail below. Any type of controller, such as a digital or analog programmable controller, can be used and any appropriate motor can be used. For use in space, all components, including the motor and controller may have to be certified or approved by the appropriate regulatory authority.

Figure 2:
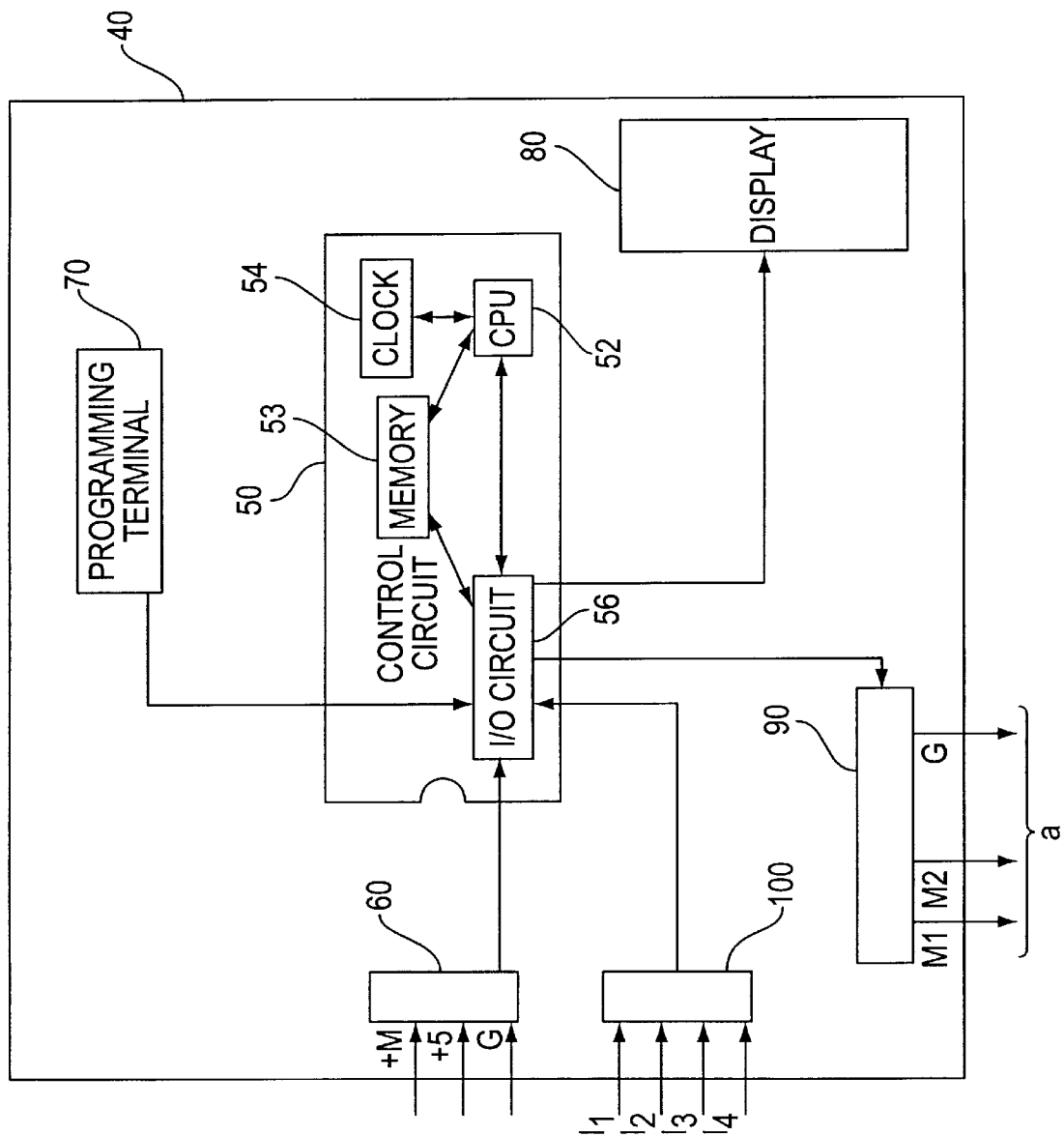
FIG. 2 is a schematic illustration of a controller for controlling the crystallization apparatus.

FIG. 2 is a schematic illustration of controller 40 for controlling motor 20 and thus the crystallization process. Controller 40 is constituted of control circuit 50, input connector 60, programming terminal 70, display 80, output connector 90, and input connector 100. Control circuit 50 includes CPU (central processing unit) 52, I/O circuit 56, clock 54, and memory 53. Control circuit 50 can be a conventional microprocessor based device, such as a personal computer or an industrial programmable controller, or control circuit 50 can be a dedicated solid state, handwired, digital, analog or mechanical controller, for example. Clock 54 generates pulses at regular intervals in a conventional manner to provide timing for the operation of the other components. Memory 53 contains operating instructions for CPU 52 to carry out the crystallization process. The operating instructions can be in the form of preprogrammed software in the case of a digital controller, hard wired components in the case of an analog controller or mechanical elements, such as cams, in the case of a mechanical controller. I/O circuit 56 provides an interface between CPU 52 and external components such as motor 20, programming terminal 70, display 80 and any sensors or actuators.

Input connector 60 includes three input connections for motor voltage (+M) a 5 volt D.C. logic voltage (+5), and a ground (G). Input connections of connector 60 are coupled to I/O circuit 56. Output connector 90 includes output connections for a first winding of motor 20 (M1), a second winding of motor 20 (M2) and ground (G). Output connections of connector 90 are coupled to I/O circuit 56 and to stepper motor 20 at (a) (as indicated in FIGS. 1 and 2.) Programming terminal 70 is coupled to CPU 52 through I/O circuit 56 to permit operating instructions to be input into the memory 53 of CPU 52. Programming terminal 70 can consist of any input device such as a keyboard, a touch screen, a bank of switches, push buttons, or the like. Once the operating instructions are stored in memory 53, programming terminal 70 can be disconnected from I/O circuit 56 or can remain connected to I/O circuit 56. Display 80 also is coupled to CPU 52 through 10 circuit 56 and serves to display operating parameters or status relating to the operation of controller 40. For example, display 80 can be a CRT, LCD display, LED display or similar device. Of course, display 80 is optional.

Once the operating instructions are stored in memory 53 through conventional programming and storage techniques, the proper input voltage is supplied to input connector 60 and output connector 90 is coupled to stepper motor 20, controller 40 can control motor 20 to operate in a predetermined manner with respect to time to thereby control the crystallization process in a desired manner. Of course, if the initial concentration of salt solution in syringes 16 and 18 and the initial concentration of salt 3solution in crystallization chamber 14 are known and the volumes of crystallization chamber 14, syringe 16, and syringe 18 are known, the operating instructions stored in memory 53 can be configured to control the crystallization process; i.e. the concentration of salt solution in crystallization chamber 14 in a dynamic manner with respect to time to provide desirable crystallization conditions at all times. Input connector 100 includes inputs $I_1$–$I^4$ for coupling additional inputs, such as limit switches, sensors, and the like, to CPU 52 through I/O circuit 56. This permits closed loop control to be achieved, based on the state of the crystallization process or other variables. Additionally, these inputs can be coupled to swiches, or the like, for initiating, terminating, interrupting or changing the operation of CPU 52. Of course the operating instructions stored in memory 53 can be programmed in accordance with any desired operation and external inputs or outputs.

Crystallization experiments were conducted using an apparatus according to the invention. The proteins crystallized were carboxy peptidase-A (CPA) and concanavalin-A (CON-A). The crystallization chamber in the apparatus used for the experiments has a volume of 1 ml. The target proteins were suspended in a dialysis bag placed in the crystallization chamber and having a volume of 50 $\mu$l.

In the experiments with CPA, the protein was disposed in the dialysis bag in a solution of 1.2M LiCl at a pH of 7.5 at a protein concentration of 12 mg/ml. The dialysis bag was then placed in the crystallization chamber and the remainder of the crystallization chamber was filled with 1.2M solution of LiCl at a pH of 7.5. One of the syringes was loaded with a 0.1M solution of LiCl at a pH of 7.5 which was injected into the crystallization chamber. Several trials were conducted under these initial conditions with the amount of salt solution transferred from the syringe to the crystallization chamber being different in each trial. In each trial, the amount of salt solution transferred from the crystallization chamber was equal to the amount of salt solution transferred to the crystallization chamber, as described above. Each of the mixing times was under 1 minute.

The results of the crystallization tests for CPA are presented below in Table 1.

TABLE 1

| Trial # | initial CC solution | ml. of .1M LiCL/7.5 injected | Results |
| --- | --- | --- | --- |
| 1 | 1.2M LiCl/7.5 | 3 ml. | No crystals |
| 2 | 1.2M LiCl/7.5 | 4 ml. | No crystals |
| 3 | 1.2M LiCl/7.5 | 5 ml. | Large crystals |
| 4 | 1.2M LiCl/7.5 | 6 ml. | Large crystals |
| 5 | 1.2M LiCl/7.5 | 6.5 ml. | Large crystals |

It can be seen that trials 1 and 2 did not lower the concentration of the salt solution in the crystallization chamber enough to produce large crystals. However, in trials 3–5 larger amounts of low concentration salt solution were transferred into the crystallization chamber and thus the concentration of salt solution was lowered into a range in which the protein can come out of solution to form large crystals. The results of trials 3–5 compared favorably to a control trial using a conventional dialysis method of crystallization. In the control trial a 50 $\mu$l dialysis bag was filled with CPA at a concentration of 12 mg/ml in 1.2M LiCl at a pH of 7.5. The dialysis bag was then suspended in 1 ml of 0.1M LiCl at a pH of 7.5. While the control trial yielded large crystals it could not be dynamically or remotely controlled because once the dialysis bag was placed in the salt solution, crystallization conditions could not be altered.

In the experiments with Con-A, the protein was disposed in the dialysis bag at a concentration of 30 mg/ml in 1M NaCl at a pH of 6.5 which was injected into the crystallization chamber. The dialysis bag was placed in the crystallization chamber and the crystallization chamber was filled with 1M NaCl at a pH of 6.5. One of the syringes was loaded with a 0.1M solution of $NaNo_3$ at a pH of 6.5. Several trials were conducted under these initial conditions with the amount of salt solution transferred from the syringe to the crystallization chamber being different in each trial. In each trial, an amount of salt solution was transferred out of the crystallization chamber, the amount being equal to the amount of solution transferred into the crystallization chamber. The results of the crystallization tests for Con-A are presented below in table 2.

TABLE 2

| Trial # | initial CC solution | ml. of .1M $NaNo_3$/ 6.5 injected | Results |
|---|---|---|---|
| 1 | 1M NaCl/6.5 | 2.5 | 1000's small crystals |
| 2 | 1M NaCl/6.5 | 3.5 | 100's small crystals |
| 3 | 1M NaCl/6.5 | 4.5 | Few Large crystals |
| 4 | 1M NaCl/6.5 | 5.5 | Few Large crystals |
| 5 | 1M NaCl/6.5 | 6.5 | Few Large crystals |

It can be seen that trials 1 and 2 did not lower the concentration of the salt solution in the crystallization chamber enough to produce large crystals. However, in trials 3–5 larger amounts concentration salt solution were transferred into the crystallization chamber and thus the concentration of salt solution was lowered into a range in which the protein can come out of solution to form large crystals. The results of trials 3–5 compared favorably to a control trial using a conventional dialysis method of crystallization. In the control trial a 50 μl dialysis bag was filled with CON-A at a concentration of 30 mg/ml in 1.0M NaCl at a pH of 6.5. The dialysis bag was thus suspended in 1 ml of 0.1M NaNo at a pH of 6.5. While the control trial yielded large crystals it could not be dynamically or remotely controlled because once the dialysis bag was placed in the salt solution, crystallization conditions could not be altered. The final molarity in the crystallization chamber in each trial has not been measured or determined empirically.

The protein in the crystallization chamber can be a membrane bound protein. In such case, a detergent can be introduced into the crystallization chamber at an appropriate time, by a microsyringe, or the like, to separate the protein from the membrane. The protein can be confined within a dialysis bag or the like or can be freely suspended in solution in the crystallization chamber.

In the preferred embodiment, syringes are used to store salt solution and plungers of the syringes are moved to transfer the salt solution. However, any arrangement for delivering salt solution to and from the crystallization chamber(s) can be used. For example, two or more reservoirs, each pair having pumps which are electrically or mechanically interlocked, can be used or a single reservoir or syringe can be used and any excess salt solution can be allowed to drain into a reservoir or the atmosphere or a valve arrangement can be used. The salt solution may be transferred to a manifold. A bank of valves may be connected to the manifold in such a way that salt solution may flow through the valves in open position to a multiplicity of crystallization chambers. In this embodiment multiple crystallizations may be carried out simultaneously. Also, the yoke interlocks the syringes in the preferred embodiment. A membrane, sieve or other suitable device may be placed at the outside entrance to the crystallization chamber. The protein solution might then be placed in the crystallization chamber. In still other embodiments, the salt solution may be transferred to a test tube, beaker or other suitable container into which may be placed a dialysis bag containing a protein solution. However, any mechanism can be used to coordinate transfer of salt solution to and from the crystallization chamber(s) such as a software interlock programmed into the controller or any other mechanical interlock.

The various dimensions, volumes and solution concentrations can be varied to provide desirable crystallization characteristics. Various sensors can be placed in the crystallization chamber, in the syringes, or at appropriate positions to detect crystallization. solution concentration, temperature, position, pressure or other variables. The outputs of such sensors can be used to control the crystallization process. The "salt" solution can be any solution having ionic or chemical characteristics that permit crystallization of the protein, The concentration of salt solution in the crystallization chamber(s) can be raised or lowered to a desired value for crystallization. The relative concentrations of salt solution in the crystallization chamber(s) and in the solution chambers can be varied, based on crystallization conditions. A second salt solution may be placed in another salt solution chamber. The concentration of salt in this chamber may be different than that of the salt concentration in other salt solution chambers.

A salt solution of appropriate concentration, to store the crystal for prolonged periods of time, may be placed in a salt solution reservoir. Fluid from this reservoir may be very slowly pumped into the actual protein containing area of the crystallization chamber through a very narrow bore access tube (<0.2 mm) or other suitable outlet. An equal volume of fluid from this area may be very slowly and concurrently pumped out of this area of the chamber through a very narrow bore access tube (<0.2 mm) or other suitable outlet.

The invention may also be used to crystallize substances other than proteins. These substances include, but are not limited to nucleic acids, nucleic acids in combination with proteins, proteins bound to lipids or glycolipids, membrane-bound proteins, viruses and subcellular organdles.

Substances other than proteins and salt solutions may be placed in the crystallization chamber or other suitable receptacle. Such substances include, but are not limited to cells, chemotactic factors, growth factors and cell culture media. The salt solution resevoirs may hold fluids other than salt solutions or other chemical solutions involved in crystallization. Membranes other than those used in dialysis may be placed in the crystallization chamber or other suitable receptacle.

In the preferred embodiment the temperature is not controlled, however a temperature controlling device may be used. Typical techniques may include using a Peltier cooler, a temperature controlled container, and heating coils imbedded in the system.

In the preferred embodiment viewing and visual recording devices (to image the interior of the crystallization chamber 14) are not shown, however any such devices are envisioned as well. Such devices may include, but are not limited to, a camera to take static photographs, a video-recording device, a magnifying device, and a magnifying device in tandem with a video-recording device.

What is claimed:

1. An apparatus for crystallizing proteins comprising:
   at least one crystallization chamber configured to contain a protein in a salt solution for crystallization of the protein;
   at least a first solution chamber and a second solution chamber, said first and second solution chambers being configured to contain respective salt solutions;
   first communicating means for communicating said first solution chamber with said crystallization chamber;
   second communicating means for communicating said second solution chamber with said crystallization chamber;
   first transfer means for selectively transferring salt solution between said first solution chamber and said crystallization chamber;
   second transfer means for selectively transferring salt solution between said second solution chamber and said crystallization chamber;
   interlocking means for interlocking said first transfer means and said second transfer means to cause said first transfer means and said second transfer means to reversibly transfer equal volumes of salt solution into and out of said crystallization chamber.

2. An apparatus as recited in claim 1, further comprising dynamic control means coupled to said first transfer means and said second transfer means for controlling the amount of salt solution transferred by said first transfer means and said second transfer means.

3. A protein crystallization apparatus as recited in claim 2, comprising
   means for monitoring and dynamically controlling crystallization in said crystallization chamber in real time.

4. A protein crystallization apparatus as recited in claim 2, comprising
   means for selectively starting and stopping a crystallization process in said crystallization chamber.

5. An apparatus as recited in claim 2, wherein said first solution chamber and said first transfer means comprise a first syringe and said second solution chamber and said second transfer means comprise a second syringe.

6. An apparatus as recited in claim 5, wherein said first transfer means and second transfer means further comprise a motor operatively coupled to said first syringe and said the second syringe.

7. An apparatus as recited in claim 6, wherein said interlocking means comprises a yoke operatively coupled between said motor and said first syringe and said second syringe.

8. An apparatus as recited in claim 7, further comprising a guide rod, said yoke being slidably mounted on the said guide rod.

9. An apparatus as recited in claim 8, wherein said first and second transfer means further comprise a lead screw coupled to a shaft of said motor, said lead screw being threadably engaged with said yoke.

10. An apparatus as recited and claim 6, wherein said control means is operatively coupled to said motor to control transfer of the protein solution.

11. An apparatus as recited in claim 1, wherein said crystallization chamber comprises a container in which one of a membrane and permanent sieve is interposed between the salt solution and the protein solution.

12. An apparatus for crystallizing proteins comprising:
    a crystallization chamber configured to contain a protein in a salt solution for crystallization of the protein;
    at least a first solution chamber and a second solution chamber, said first solution chamber and second solution chamber being configured to contain respective salt solutions;
    a first conduit coupling said first solution chamber with said crystallization chamber;
    a second conduit coupling said second solution chamber with said crystallization chamber;
    a first transfer mechanism configured to selectively transfer salt solution between said first solution chamber and said crystallization chamber;
    a second transfer mechanism configured to selectively transfer salt solution between said second solution chamber and said crystallization chamber;
    an interlock coupling said first transfer mechanism and said second transfer mechanism to cause said first transfer mechanism and said second transfer mechanism to reversibly transfer equal volumes of salt solution into and out of said crystallization chamber.

13. An apparatus as recited in claim 12, further comprising a controller coupled to said first transfer mechanism and said second transfer mechanism to control the amount of salt solution transferred by said first transfer mechanism and said second transfer mechanism.

14. An apparatus as recited in claim 12, wherein said crystallization chamber comprises a container and a dialysis bag disposed in said container said dialysis bag being configured to hold the protein.

* * * * *